United States Patent [19]

Ruuskanen

[11] Patent Number: 5,786,718
[45] Date of Patent: Jul. 28, 1998

[54] METHOD AND DEVICE FOR SYMMETRIZING A CLOCK SIGNAL

[75] Inventor: Markku Ruuskanen, Porvoo, Finland

[73] Assignee: Nokia Telecommunications Oy, Espoo, Finland

[21] Appl. No.: 649,721

[22] PCT Filed: Nov. 24, 1994

[86] PCT No.: PCT/FI94/00525

§ 371 Date: May 22, 1996

§ 102(e) Date: May 22, 1996

[87] PCT Pub. No.: WO95/15030

PCT Pub. Date: Jun. 1, 1995

[51] Int. Cl.⁶ ............................. H03K 3/017
[52] U.S. Cl. .................. 327/166; 327/170; 327/176
[58] Field of Search .................. 327/141, 142, 327/146, 147, 155, 156, 158, 159, 161, 164, 165, 166, 170, 172, 174, 175, 176, 178

[56] References Cited

U.S. PATENT DOCUMENTS

| | | | |
|---|---|---|---|
| 4,449,102 | 5/1984 | Frazer | 327/165 |
| 4,959,557 | 9/1990 | Miller | 327/175 |
| 5,144,645 | 9/1992 | Schiffmann | 377/47 |

FOREIGN PATENT DOCUMENTS

| | | | |
|---|---|---|---|
| 343 899 | 11/1989 | European Pat. Off. | |
| 362293815 | 12/1987 | Japan | 327/175 |
| 363013519 | 1/1988 | Japan | 327/175 |
| 363246025 | 10/1988 | Japan | 327/175 |
| 403117913 | 5/1991 | Japan | 327/175 |
| 403166813 | 7/1991 | Japan | 327/175 |
| 404096416 | 3/1992 | Japan | 327/175 |
| 405252007 | 9/1993 | Japan | 327/175 |
| 406209242 | 7/1994 | Japan | 327/175 |

*Primary Examiner*—My-Trang Nu Ton
*Attorney, Agent, or Firm*—IP Group of Pillsbury Madison & Sutro LLP

[57] ABSTRACT

The present invention relates to a method and device for symmetrizing a clock signal. The leading or trailing edge of each pulse of the clock signal ($F_{in}$) to be symmetrized is used for forming the first edge of the pulse of the corresponding symmetrized clock signal ($F_{out}$). The pulse ratio of the symmetrized clock signal is measured; and on the basis of the measured pulse ratio, the time constant circuit (R1, C1), determining the location of the second edge of the pulse of the symmetrized clock signal, is adjusted by means of a control loop (R6, C2, A) in such a manner that the second edge of the pulse of the symmetrized clock signal ($F_{out}$) settles in a desired position in the symmetrized clock signal. (FIG. 1)

4 Claims, 1 Drawing Sheet

METHOD AND DEVICE FOR SYMMETRIZING A CLOCK SIGNAL

BACKGROUND OF THE INVENTION

1. Field of the Invention

The present invention relates to a method and device for symmetrizing a clock signal.

2. Background

Various components such as microprocessors have strict quality requirements regarding the symmetry of the pulse ratio of the clock signal they used, especially in operating near the upper frequency limit specified for their components.

The symmetrization of a clock signal can be carried out automatically using a regulator comprising a feed-back loop. In a known (e.g. U.S. Pat. No. 4,959,557) device, a clock signal is applied as AC-coupled via a low pass filter to a buffer circuit, from the output of which a symmetrized clock signal is obtained. The regulation of the pulse ratio is implemented by feeding the output signal of the buffer circuit to an integrator, from which a DC voltage proportional to the pulse ratio of the signal is obtained. This voltage is compared with the desired set value voltage of the pulse ratio in an amplifier, which produces a control voltage on the basis of the measured and the set-value voltage. This control voltage is passed as a bias voltage to the same input of the buffer circuit where the clock signal to be symmetrized has also been passed. The trigger level, which the buffer circuit detects in the incoming clock signal, is controlled by the bias voltage.

Since the leading and trailing edges of the incoming clock signal have been graded by the low pass filter, the pulse ratio of the output signal of the buffer circuit also changes as the bias voltage changes. The controller seeks to find such a trigger level from the incoming clock signal above and below which level the durations of the clock signal states are equally long.

The pulse ratio of commercially available conventional crystal oscillators is normally promised to be about 40/60. If a better pulse ratio is desired, the price of the oscillator goes up considerably. If the pulse ratio is adjusted manually, the productional testing costs of the manufactured device increase.

The disadvantages of the known device based on a feedback control loop are the following:

it restricts the pulse ratio of an incoming signal, whereby the device seeks to find such a trigger level from the incoming signal above and below which level the periods of the signal are equally long. If the pulse ratio of an incoming signal is sufficiently poor, this kind of trigger level will not be found.

the accuracy of adjustment is dependent on the pulse ratio of an incoming signal.

both edges of the clock signal produced by the device are in random phase with respect to the phases of the edges of an incoming clock signal, i.e. it is not possible to use the device in decentralized applications, in which the phase of either edge of an incoming clock signal has to be maintained.

SUMMARY OF THE INVENTION

The object of the present invention is to provide a method and device for symmetrizing a clock signal without the above-mentioned restrictions and disadvantages. To achieve this, the method of the invention is characterized in that the leading or trailing edge of each pulse of the clock signal to be symmetrized is used for forming the first edge of the pulse of the corresponding symmetrized clock signal; the pulse ratio of the symmetrized clock signal is measured; and on the basis of the measured pulse ratio, the time constant circuit determining the location of the second edge of the pulse of the symmetrized clock signal is adjusted by means of a control loop in such a manner that the second edge of the pulse of the symmetrized clock signal settles in a desired position in the symmetrized clock signal.

By means of the method according to the invention, it is possible to symmetrize even a clock signal with a poor pulse ratio so as to be suitable for use in applications of critical timing. The implementation of the device of the invention is simple. The restrictions of the solution based on a known controller have been obviated by forming one edge of the symmetrized clock signal directly from the clock signal to be symmetrized, and the other edge by means of an independently adjustable time constant circuit.

The device of the invention and the other preferred embodiments of the invention are characterized by what is presented in the claims that will follow later.

BRIEF DESCRIPTION OF THE DRAWINGS

In the following, the invention will be described in more detail by means of an example with reference to the accompanying drawing, in which.

BRIEF DESCRIPTION OF THE PRESENTLY PREFERRED EXEMPLARY EMBODIMENTS

Figure 1:
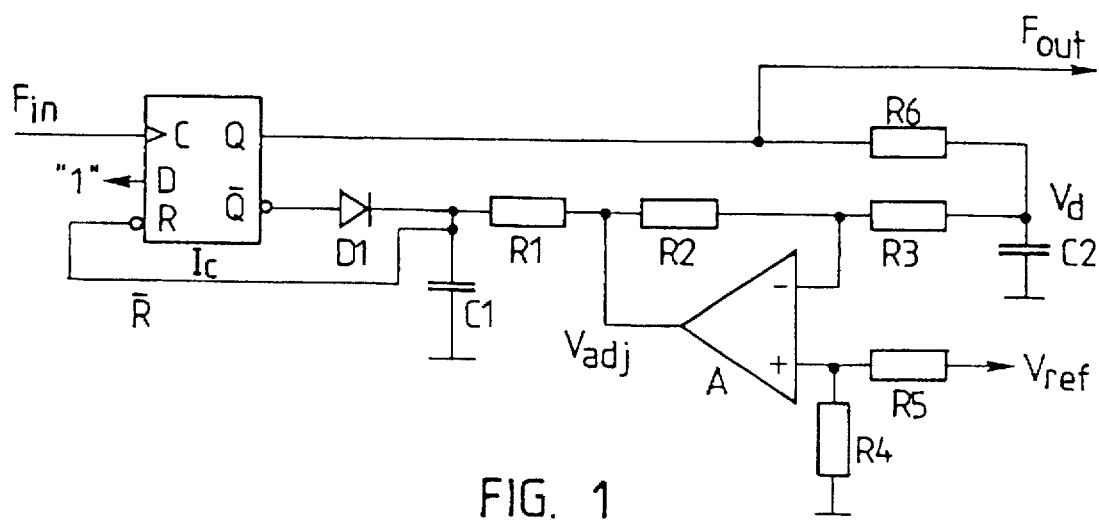
FIG. 1 shows the device of the invention for symmetrizing a clock signal.
Figure 2:
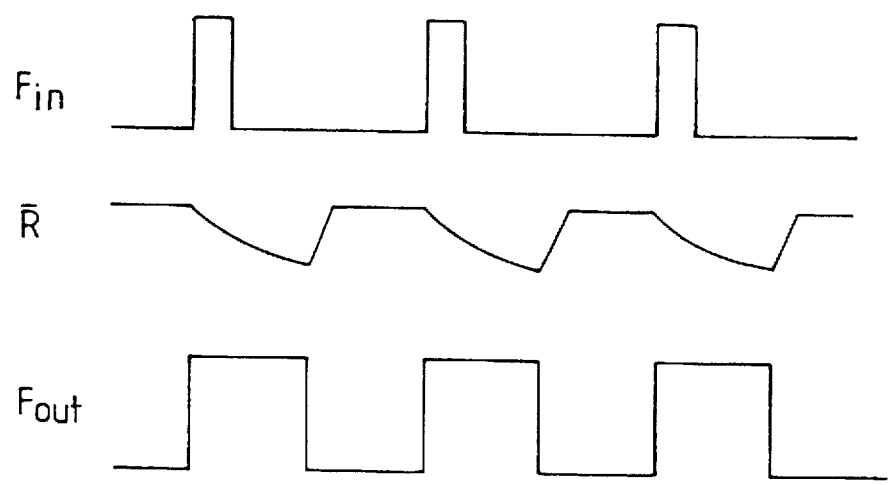
FIG. 2 shows a timing diagram relating to the circuit according to FIG. 1.

In FIG. 1, the incoming clock signal $F_{in}$ to be symmetrized is passed as a clock to a D-flip-flop circuit IC. A 1-state signal is obtained at the leading edge of the clock signal $F_{in}$ from the output Q of the IC. At the same moment, a 0-state signal is obtained from the output $\overline{Q}$ of the IC, whereby the voltage of a diode D1 changes to reverse.

The signal $\overline{R}$ of the D-flip-flop IC is connected to a time constant circuit R1 and C1. By means of a voltage $V_{adj}$ the voltage of a capacitor C1 is discharged until the IC detects the signal $\overline{R}$. At this moment, the output Q, of the D-flip-flop changes to state 0, and the output $\overline{Q}$ to state 1, whereby the capacitor C1 is charged through the diode D1 to a constant voltage, and the signal $\overline{R}$ is deactivated.

The phases mentioned above are repeated after each leading edge of the incoming signal. A clock signal $F_{out}$ is thus obtained from the output of the D-flip-flop IC, the leading edge of this clock signal coinciding with the leading edge of the incoming clock signal $F_{in}$ to be symmetrized, and the position of the trailing edge of this clock signal being determined by the time constant circuit R1 and C1.

The formed $F_{out}$ signal is symmetrized by using a feed-back control loop. The clock signal $F_{out}$ is applied to an integrator R6 and C2 ; and a DC voltage $V_d$, which is proportional to the pulse ratio of the $F_{out}$ signal and which is obtained from the output of the integrator R6 and C2, is applied to the inverting input of an operational amplifier A. A voltage $V_{ref}$ corresponding to the set value of the pulse ratio is also applied to the amplifier A via a voltage divider R4 and R5.

The amplifier A compares the voltage $V_d$, which is proportional to the pulse ratio of the formed clock signal $F_{out}$ with the set value voltage $V_{ref}$ and forms a control voltage $V_{adj}$, by which the time constant circuit R1 and C1 is controlled. If the length of the 1-state of the formed clock signal is too great with respect to the length of the 0-state, the amplifier A reduces the control voltage $V_{adj}$. The capacitor C1 is thus discharged faster, and the signal R is activated earlier, whereby the pulse ratio is corrected. If the 0-state of the clock signal $F_{out}$ is too long, the amplifier A increases the control voltage $V_{adj}$, whereby the signal R is activated later.

As a final result, a symmetrized clock signal $F_{out}$ is obtained from the D-flip-flop IC. The values of the time constant circuit R1 and C1 are dimensioned according to the frequency of the used clock signal. The accuracy of the dimensioning also affects the obtained accuracy of the adjustment.

The device of the invention can be used for symmetrizing clock signals at digital telephone exchanges; for instance, a clock signal of the frequency of 16.384 MHz formed by the crystal oscillator of the synchronization unit of a Nokia DX 200 exchange. In the following, the part list of the device suitable for this purpose is presented with references according to FIG. 1.

| $F_{in}$ = 16.384 MHz, $V_{ref}$ = 2.5 V | | | |
| --- | --- | --- | --- |
| IC | 74AC74 | R5 | 1 kΩ |
| A  | LF356  | R6 | 1 kΩ |
| R1 | 270 Ω  | C1 | 47 pF |
| R2 | 10 kΩ  | C2 | 100 nF |
| R3 | 1 kΩ   | D1 | 1N4153 |
| R4 | 10 kΩ  |    |        |

All the components in the above part list are standard components, the acquisition and use of which are obvious to a professional in the art. Furthermore, it is apparent that the component values of the time constant circuit must be dimensioned application-specifically according to the frequency of the clock signal to be symmetrized.

In this case, the gain of the amplifier A is selected to be −10. The amplifier compares the reference voltage $V_{ref}$(+2.5 V) of the set pulse ratio with the voltage $V_d$, which is proportional to the pulse ratio of the formed clock signal. The amplifier A seeks to adjust the voltage $V_d$ to the set value $V_{ref}$.

It is apparent to a professional in the art that the different embodiments of the invention are not restricted to the example presented above, but that they can vary within the scope of the appended claims.

I claim:

1. A device for creating a symmetrized output clock signal from an input clock signal, each of the input and output clock signals comprising pulses having a first edge, a second edge and a pulse ratio, wherein the device comprises:

a pulse shaping circuit coupled to the input clock signal for forming at the first edge of each pulse of the input clock signal the first edge of each corresponding pulse of the output clock signal;

measuring means for measuring the pulse ratio of the output clock signal and producing a signal representing the pulse ratio, a control circuit operationally coupled to the measuring means for forming control voltage;

a time constant circuit operationally coupled to the control circuit; the time constant circuit having an output voltage a slew rate of which is dependent on the control voltage; and wherein the output voltage of the time constant circuit is operationally coupled to the pulse shaping circuit which is arranged to form the second edge of each pulse of the output clock signal in response to the output voltage of the time constant circuit reaching a level detectable by the pulse shaping circuit;

said pulse shaping circuit being a flip-flop comprising a first input and a second input, wherein the first input is a clock input connected to the input clock signal and the second input is a reset input connected to the time constant circuit.

2. A device according to claim 1 wherein the control circuit comprises an amplifier being arranged to compare the signal representing the pulse ratio with a pre-set level, and to form the control voltage to the time constant circuit on the basis of the comparison.

3. A device according to claim 1 wherein the time constant circuit comprises an energy storing element connected such that:

the control circuit is arranged to discharge the energy storing element from its maximum value towards the control voltage beginning at the first edge of the output clock signal; and the pulse shaping circuit is arranged to charge the energy storing element towards its maximum value beginning at the second edge of the output clock signal.

4. A device for creating a symmetrized output clock signal from an input clock signal each of the input and output clock signals comprising pulses having a first edge, a second edge and a pulse ratio, wherein the device comprises:

a pulse shaping circuit coupled to the input clock signal for forming at the first edge of each pulse of the input clock signal the first edge of each corresponding pulse of the output clock signal;

measuring means for measuring the pulse ratio of the output clock signal and producing a signal representing the pulse ratio;

a control circuit operationally coupled to the measuring means for forming control voltage;

a time constant circuit operationally coupled to the control circuit; the time constant circuit having an output voltage a slew rate of which is dependent on the control voltage; and wherein the output voltage of the time constant circuit is operationally coupled to the pulse shaping circuit which is arranged to form the second edge of each pulse of the output clock signal in response to the output voltage of the time constant circuit reaching a level detectable by the pulse shaping circuit;

said pulse shaping circuit being a flip-flop comprising a first input and a second input, wherein the first input is a clock input connected to the input clock signal and the second input is a reset input connected to the time constant circuit;

the time constant circuit essentially consisting of one resistor and one capacitor connected to the reset input.

* * * * *

UNITED STATES PATENT AND TRADEMARK OFFICE
CERTIFICATE OF CORRECTION

PATENT NO. : 5,786,718
DATED : July 28, 1998
INVENTOR(S) : RUUSKANEN, Markku

It is certified that error appears in the above-identified patent and that said Letters Patent is hereby corrected as shown below:

On the title page,

--[30]  Foreign Application Priority Data
November 24, 1993  [FI]  Finland............935225--

Signed and Sealed this

Eighteenth Day of May, 1999

Attest:

Q. TODD DICKINSON

Attesting Officer

Acting Commissioner of Patents and Trademarks